United States Patent
Otremba

(10) Patent No.: US 7,800,208 B2
(45) Date of Patent: Sep. 21, 2010

(54) DEVICE WITH A PLURALITY OF SEMICONDUCTOR CHIPS

(75) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 36 days.

(21) Appl. No.: 11/925,297

(22) Filed: Oct. 26, 2007

(65) Prior Publication Data

US 2009/0108467 A1    Apr. 30, 2009

(51) Int. Cl.
*H01L 23/02* (2006.01)

(52) U.S. Cl. ......... 257/678; 257/E23.01; 257/E21.502

(58) Field of Classification Search .......... 257/686, 257/678
See application file for complete search history.

(56) References Cited

U.S. PATENT DOCUMENTS

| | | | |
|---|---|---|---|
| 6,166,434 A | | 12/2000 | Desai et al. |
| 6,271,056 B1 * | | 8/2001 | Farnworth et al. .......... 438/106 |
| 6,927,483 B1 * | | 8/2005 | Lee et al. .................... 257/676 |
| 6,943,455 B1 | | 9/2005 | Maxwell |
| 7,271,470 B1 * | | 9/2007 | Otremba .................... 257/666 |
| 2002/0050635 A1 * | | 5/2002 | Ogura et al. ............... 257/686 |
| 2002/0125550 A1 | | 9/2002 | Estacio |
| 2004/0232538 A1 * | | 11/2004 | Linke ........................ 257/686 |
| 2005/0056914 A1 * | | 3/2005 | Hong et al. ................. 257/666 |
| 2005/0218498 A1 | | 10/2005 | Hata et al. |
| 2006/0118927 A1 * | | 6/2006 | Verma et al. ............... 257/676 |
| 2006/0145319 A1 | | 7/2006 | Sun et al. |
| 2006/0186525 A1 * | | 8/2006 | Theuss et al. ............... 257/686 |
| 2006/0202319 A1 * | | 9/2006 | Swee Seng ................. 257/686 |
| 2007/0181989 A1 * | | 8/2007 | Corisis et al. .............. 257/686 |

FOREIGN PATENT DOCUMENTS

DE    19733702 B4    2/2006

* cited by examiner

*Primary Examiner*—Davienne Monbleau
*Assistant Examiner*—Nikolay Yushin
(74) *Attorney, Agent, or Firm*—Dicke, Billig & Czaja, PLLC

(57) ABSTRACT

A device with a plurality of semiconductor chips is disclosed. One embodiment provides a substrate. A first semiconductor chip is mounted over the substrate. A second semiconductor chip is mounted over the first semiconductor chip. A first electrically conducting element electrically couples the second semiconductor chip to the substrate and a mold material covers the first electrically conducting element only partially.

16 Claims, 4 Drawing Sheets

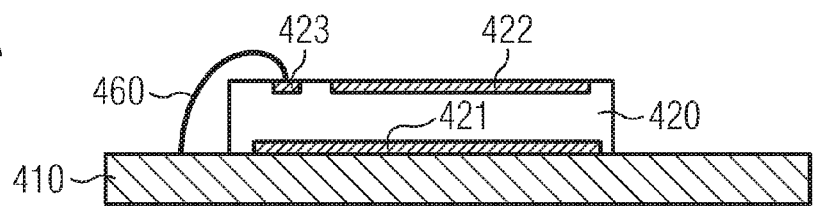
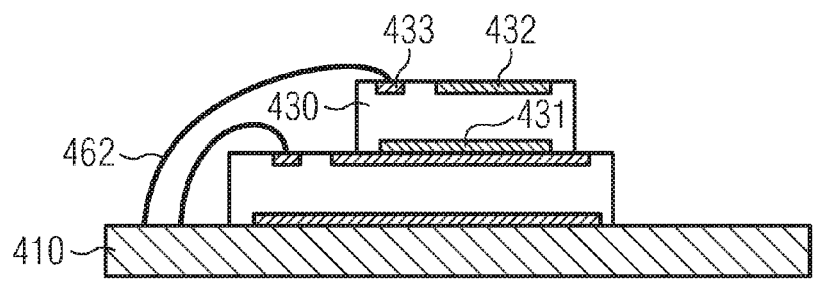
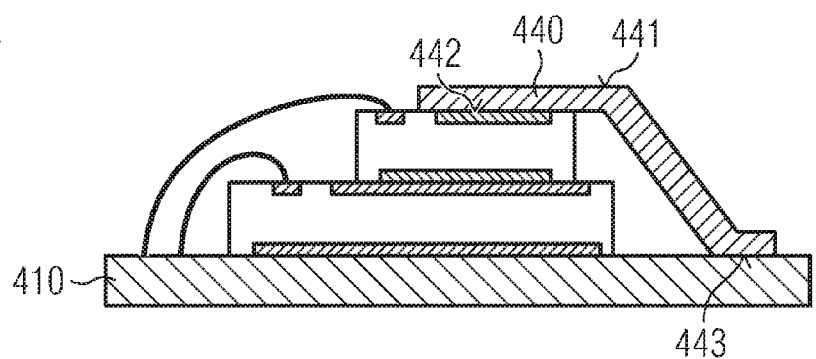
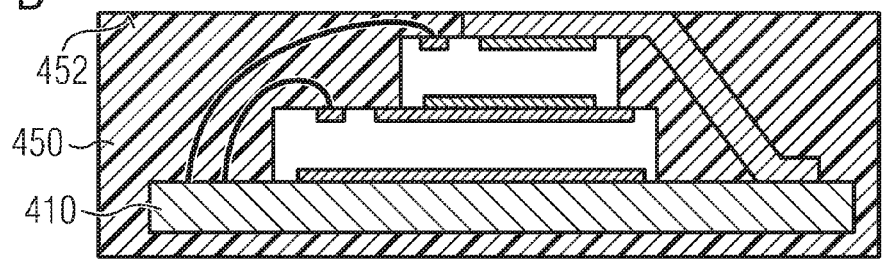
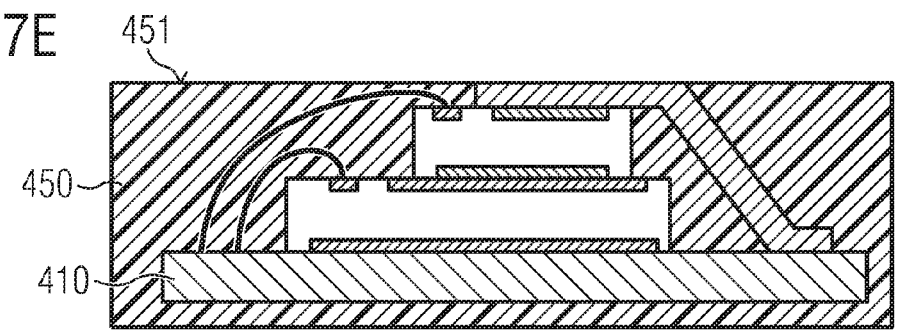

DEVICE WITH A PLURALITY OF SEMICONDUCTOR CHIPS

BACKGROUND

This invention relates to a device that includes a plurality of semiconductor chips and a method of making a device including a plurality of semiconductor chips.

Power semiconductor chips may, for example, be integrated into semiconductor devices. Power semiconductor chips are suitable, in one embodiment, for the switching or control of currents and/or voltages. Power semiconductor chips may, for example, be configured as power transistors, power diodes or IGBTs (Insulated Gate Bipolar Transistors).

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 7A to 7E schematically illustrate a method according to a further exemplary embodiment.

DETAILED DESCRIPTION

Figure 1:
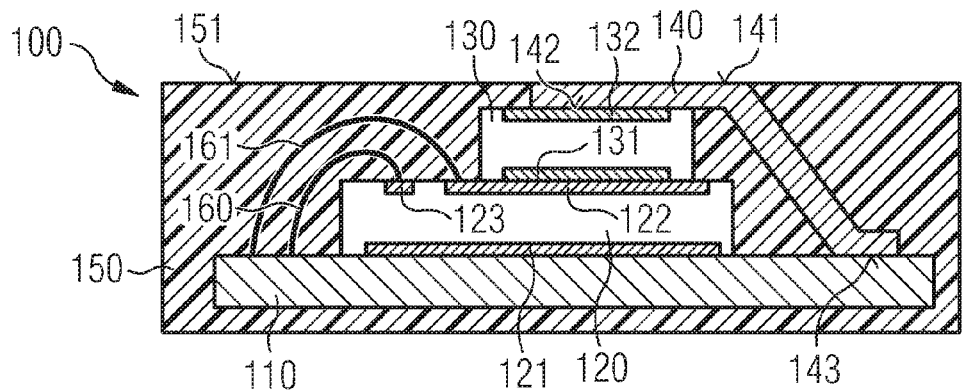
FIG. 1 schematically illustrates a side view of a device 100 according to one exemplary embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Example devices with semiconductor chips are described below. The semiconductor chips may be of extremely different types and may include for example integrated electrical or electro-optical circuits. The semiconductor chips may, for example, be configured as power MOSFETs, such as power transistors, power diodes or IGBTs (Insulated Gate Bipolar Transistors). Furthermore, the semiconductor chips may include control circuits, microprocessors or microelectromechanical components. In one embodiment, semiconductor chips of vertical type may be involved, which are fabricated in such a way that electric currents can flow in a direction substantially perpendicular to the main surfaces of the semiconductor chips. In a semiconductor chip having a vertical structure, the electrodes through which the current is conducted are arranged on at least two surfaces of the semiconductor chip, the surfaces being arranged on two opposite sides of the semiconductor chip. In one embodiment, power transistors, power diodes and IGBTs may have a vertical structure. By way of example, the source and drain electrodes of a power transistor, the anode and cathode electrodes of a power diode and the emitter and collector electrodes of an IGBT may be situated on opposite surfaces of the respective power semiconductor chip.

The devices described below may include integrated circuits to control other integrated circuits, for example, the integrated circuits of power transistors, power diodes or IGBTs. The semiconductor chips need not be manufactured from specific semiconductor material and, furthermore, may contain inorganic and/or organic materials that are not semiconductors, such as for example insulators, plastics or metals. Moreover, the semiconductor chips may be packaged or unpackaged.

Substrates as set forth hereinbelow may be of any suitable material including metals, metal alloys, organic materials. In one embodiment, substrates as described below may be configured as leadframes having at least one die pad and a plurality of leads arranged to contact electrodes of the semiconductor chips with the leads to electrically connect the device as a whole with electrical contacts outside the device.

The semiconductor chips may have electrodes (or contact pads) which allow electrical contact to be made with the semiconductor chips. The electrodes may be composed of any desired electrically conductive material, for example of a metal, such as copper, aluminum or gold, a metal alloy or an electrically conductive organic material.

One or more electrically conductive elements may be used to electrically couple the semiconductor chips to other components, such as the substrate for example. The electrically conductive elements may be bond wires, but may be other electrically conductive structures as well, such as clips. The clips may, for example, be formed by stamping or embossing metal stripes.

The devices described below include external contact elements. The external contact elements are accessible from outside the device and allow electrical contact to be made with the semiconductor chip from outside the device. Furthermore, the external contact elements may be thermally conductive and may serve as heat sinks for dissipating the heat generated by the semiconductor chips. The external contact elements may be composed of any desired electrically conductive material, for example of a metal, such as copper, aluminum or gold, a metal alloy or an electrically conductive organic material. The external contact elements or surfaces of them may also form assembly planes to mount the device onto another element or to mount another element onto the device.

FIG. 1 schematically illustrates a side view of a device 100 according to an exemplary embodiment. A first semiconductor chip 120 is mounted over a substrate 110. A second semiconductor chip 130 is mounted over the first semiconductor chip 120. An electrically conducting element 140 is coupled to the second semiconductor chip 130 via a first surface 142 and to the substrate via a second surface 143. A mold material 150 is arranged to cover the substrate 110, the first semiconductor chip 120, the second semiconductor chip 130 and only partially the electrically conducting element 140. A surface 141 of the electrically conducting element 140 may be exposed from the mold material 150. Additionally, other surfaces of the electrically conducting element 140 may be exposed from the mold material 150 as well.

The substrate 110 may be a leadframe. At least one of the first semiconductor chip 120 and the second semiconductor chip 130 may comprise a power semiconductor chip. The first semiconductor chip 120 may comprise a first electrode 121 on a first surface and a second electrode 122 on a second surface. Furthermore, the first semiconductor chip 120 may comprise a third electrode 123 on the second surface. In one embodiment, if the first semiconductor chip 120 is implemented as a power semiconductor chip, in one embodiment a power MOSFET, the first electrode 121 may be a drain electrode, the second electrode 122 may be a source electrode and the third electrode 123 may be a gate electrode. The first electrode 121 may be electrically coupled to first connection structures on the substrate 110. The second electrode 122 may be coupled to second connection structures on the substrate 110. The third electrode 123 may be electrically coupled to third connection structures on the substrate 110. In one embodiment, the electrical coupling of the second electrode 122 and the third electrode 123 may be achieved by wiring, in one embodiment by a bond wire 160 connecting the third electrode 123 with the substrate 110 and by a bond wire 161 connecting the second electrode 122 with the substrate 110. As an alternative to the bond wires 160 and/or 161 other connecting means, such as metal clips, may be used.

The second semiconductor chip 130 may include a first electrode 131 on a first surface and a second electrode 132 on a second surface. The second electrode 132 of the second semiconductor chip may be electrically coupled to the electrically conducting element 140 via the first surface 142 of the electrically conducting element 140. In one embodiment, the second semiconductor chip 130 may be a power diode, wherein the first electrode 131 may be a cathode and the second electrode 132 may be an anode. The first electrode 131 of the second semiconductor chip 130 may be electrically coupled to the second electrode 122 of the first semiconductor chip 120. The first electrode 131 of the second semiconductor chip 130 may be electrically coupled to the substrate 110 by means of the bond wire 161 or any other connecting means, for example a metallic clip.

The electrically conducting element 140 may consist of a metallic structure, in one embodiment it may be a copper structure, a nickel structure or a metal alloy structure. The electrically conducting element 140 may be coupled to fourth connection structures on the substrate 110, in one embodiment it may be coupled to the substrate 110 by means of solder material. The electrically conducting element 140 may be configured as a metal clip. The metal clip may have been formed from a metal stripe by stamping or embossing or any other suitable technique. A fixed electric potential, in one embodiment a reference or ground potential, may be applied to the electrically conducting element 140.

The mold material 150 may be any appropriate thermosetting or thermoplastic material. The mold material 150 may be configured to partially or fully cover the substrate 110. If the substrate 110 is implemented as a leadframe, the mold material 150 may be configured to leave parts of the leads of the leadframe exposed. The mold material 150 may further be arranged to leave at least one surface 141 of the electrically conducting element 140 uncovered, whereas other surfaces of the electrically conducting element 140 may be covered with the mold material 150. The exposed surface 141 of the electrically conducting element 140 may form an essentially planar surface together with an upper surface 151 of the mold material 150. The exposed surface 141 of the electrically conducting element 140 may also be elevated with respect to the surface 151 of the mold material 150 in a direction perpendicular to the first surface of the first semiconductor chip 120. The exposed surface 141 of the electrically conducting element 140 may also be recessed with respect to the surface 151 of the mold material 150 in a direction perpendicular to the first surface of the first semiconductor chip 120.

A heat sink or cooling element may be attached to the exposed surface 141 of the electrically conducting element 140. The heat sink or cooling element can dissipate the heat generated by the semiconductor chips 120 and/or 130. Furthermore, it is possible to attach the heat sink or cooling element directly onto the exposed surface 141 of the electrically conducting element 140. Furthermore, the heat sink or cooling element may be fabricated from an electrically conducting material, such as a metal, and may be in electrical contact to the electrically conducting element 140 via the exposed surface 141. It is not necessary to arrange an electrically insulating layer between the exposed surface 141 and the heat sink or cooling element if a ground potential is applied to the electrically conducting element 140.

Figure 2:
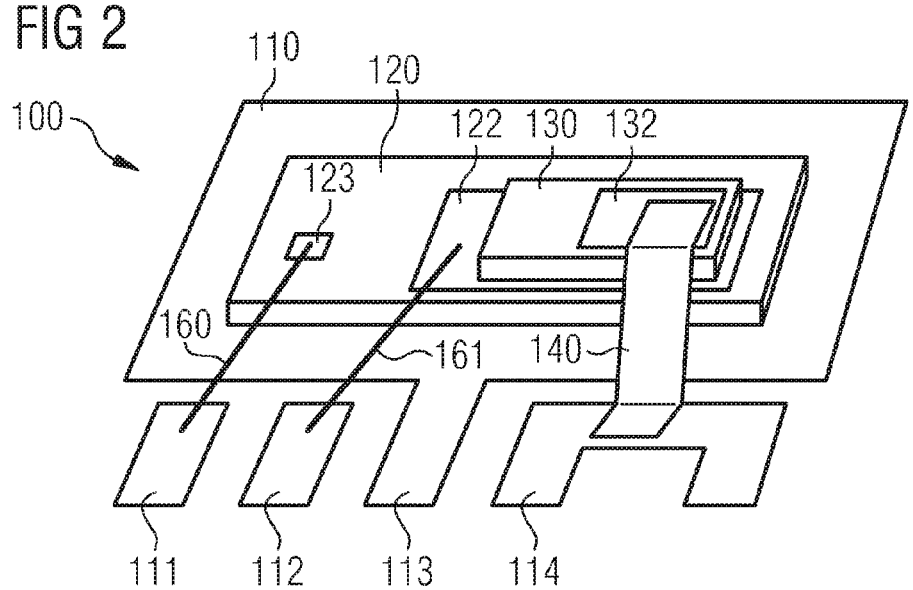
FIG. 2 schematically illustrates a foreshortened top view of the device 100 according to a further exemplary embodiment.

FIG. 2 schematically illustrates a foreshortened top view of the device 100 according to an exemplary embodiment. The substrate 110 is implemented as a leadframe which includes a die pad 110 and leads 111 to 114. The first semiconductor chip 120 may be a power semiconductor chip, in one embodiment a power MOSFET. An electrode 123 of the first semiconductor chip 120 may be electrically coupled with a bond wire 160 to the lead 111. In one embodiment, the lead 111 may be a gate connection lead. An electrode 122 of the first semiconductor chip 120 may be electrically coupled with a bond wire 161 to the lead 112. In one embodiment, the lead 112 may be a source connection lead. An electrode 121 (not visible) of the first semiconductor chip 120 is electrically coupled to the die pad 110, which is in turn electrically coupled to the lead 113. In one embodiment, the lead 113 may be a drain connection lead. Furthermore, the lead 113 may be part of the die pad 110.

The electrically conducting element 140 is implemented as a metallic clip structure electrically coupling the second electrode 132 of the second semiconductor chip 130 to the lead 114. The lead 114 may in one embodiment be a ground potential connection lead. For reasons of clarity, the mold material 150 covering the device 100 is not illustrated in FIG. 2. The mold material 150 may be arranged to expose parts of the leads 111 to 114.

The size, area of extension, thickness and orientation of the first semiconductor chip 120 and the second semiconductor chip 130 may vary and are not to be taken in a limiting sense when judging from the proportions illustrated in the drawings. In one embodiment, the form and area of extension of the electrodes of the semiconductor chips 120, 130 may vary and differ from the rectangular shape illustrated in the FIGS. 1 and 2.

Figure 3:
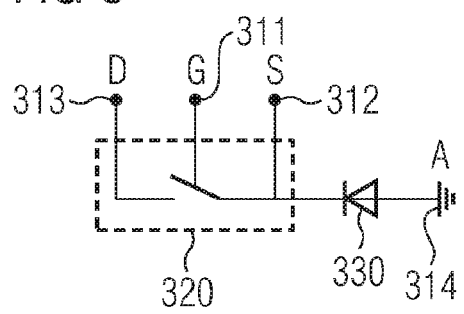
FIG. 3 schematically illustrates the wiring scheme of the device 100 according to a further exemplary embodiment.

FIG. 3 schematically illustrates the wiring scheme of the device 100 according to an exemplary embodiment. The wiring scheme is that of a half-bridge. The first semiconductor chip 120 is a power MOSFET 320 which is indicated by a dotted line. The power MOSFET 320 has a drain electrode 313 (D), a source electrode 312 (S) and a gate electrode 311 (G). The second semiconductor chip 130 is a power diode 330. The source electrode 312 is coupled to the cathode of the power diode 330. The anode of the power diode 330 is coupled to the ground potential 314.

Figure 4:
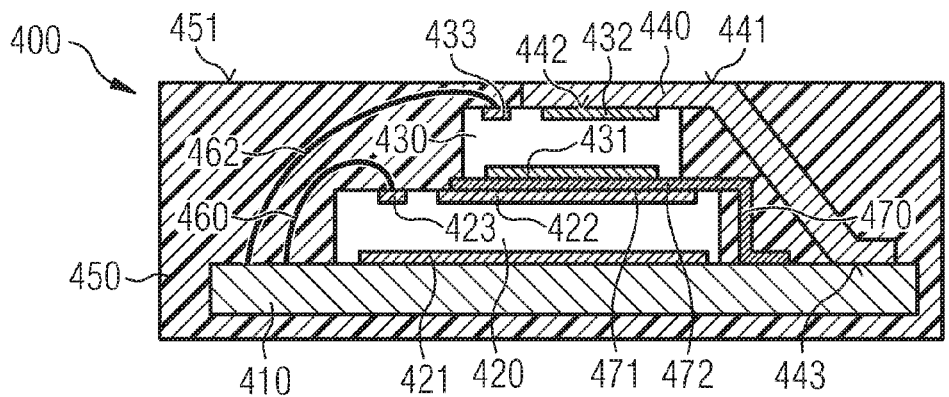
FIG. 4 schematically illustrates a side view of a device 400 according to a further exemplary embodiment.

FIG. 4 schematically illustrates a side view of a device 400 according to a further exemplary embodiment. A first semiconductor chip 420 is mounted over a substrate 410. A second semiconductor chip 430 is mounted over the first semiconductor chip 420. A first electrically conducting element 440 is coupled to the second semiconductor chip 430 via a first surface 442 and to the substrate via a second surface 443. A second electrically conducting element 470 is arranged between the first semiconductor chip 420 and the second semiconductor chip 430, the second electrically conducting element 470 being electrically coupled to the substrate 410. A mold material 450 is arranged to cover the substrate 410, the first semiconductor chip 420, the second semiconductor chip 430 and only partially the first electrically conducting element 440. An upper surface 441 of the first electrically conducting element 440 may be exposed from the mold material 450. Additionally, other surfaces of the first electrically conducting element 440 may be exposed from the mold material 450 as well.

The substrate 410 may be a leadframe. At least one of the first semiconductor chip 420 and the second semiconductor chip 430 may be a power semiconductor chip. The first semiconductor chip 420 may include a first electrode 421 on a first surface and a second electrode 422 on a second surface. Furthermore, the first semiconductor chip 420 may include a third electrode 423 on the second surface. In one embodiment, if the first semiconductor chip 420 is implemented as a power semiconductor chip, in one embodiment a power MOSFET, the first electrode 421 may be a drain electrode, the second electrode 422 may be a source electrode and the third electrode 423 may be a gate electrode. The first electrode 421 may be electrically coupled to first connection structures on the substrate 410. The second electrode 422 may be coupled to second connection structures on the substrate 410 via the second electrically conducting element 470. The third electrode 423 may be electrically coupled to third connection structures on the substrate 410. In one embodiment, the electrical coupling of the third electrode 423 may be achieved by wiring, in one embodiment by a bond wire 460 connecting the third electrode 423 with the substrate 410.

The second semiconductor chip 430 may comprise a first electrode 431 on a first surface and a second electrode 432 and a third electrode 433 on a second surface. The second electrode 432 of the second semiconductor chip may be electrically coupled to the first electrically conducting element 440 via the first surface 442 of the first electrically conducting element 440. In one embodiment, the second semiconductor chip 430 may be a power MOSFET, wherein the first electrode 431 may be a drain electrode and the second electrode 432 may be a source electrode. The third electrode 433 of the second semiconductor chip 430 may be a gate electrode. The first electrode 431 of the second semiconductor chip 430 may be electrically coupled to the second electrode 422 of the first semiconductor chip 420 via the second electrically conducting element 470. The third electrode 434 of the second semiconductor chip 430 may be electrically coupled to the substrate 410 by means of a bond wire 462.

The first electrically conducting element 440 may be a metal clip, in one embodiment it may be fabricated from copper, nickel or a metal alloy. The first electrically conducting element 440 may be coupled to fourth connection structures on the substrate 410, in one embodiment it may be coupled to the substrate 410 by means of solder material. The first electrically conducting element 440 may be applied with a fixed electric potential, in one embodiment a ground potential.

The second electrically conducting element 470 may also be configured as a metal clip. The second electrically conducting element 470 may be coupled to the second connection structures on the substrate 410, in one embodiment it may be coupled to the substrate 410 by means of solder material.

The mold material 450 may be any appropriate thermosetting or thermoplastic material. The mold material 450 may be configured to partially or fully cover the substrate 410. The mold material 450 may further be arranged to leave at least one surface 441 of the first electrically conducting element 440 uncovered, whereas other surfaces of the first electrically conducting element 440 may be covered with mold material 450. The exposed surface 441 of the first electrically conducting element 440 may form an essentially planar surface with a surface 451 of the mold material 450. Alternatively, the exposed surface 441 of the first electrically conducting element 440 may be elevated with respect to the surface 451 of the mold material 450 in a direction perpendicular to the first surface of the first semiconductor chip 420. According to a further alternative, the exposed surface 441 of the first electrically conducting element 440 may be recessed with respect to the surface 451 of the mold material 450 in a direction perpendicular to the first surface of the first semiconductor chip 420. A heat sink or cooling element may be directly attached onto the exposed surface 441.

Figure 5:
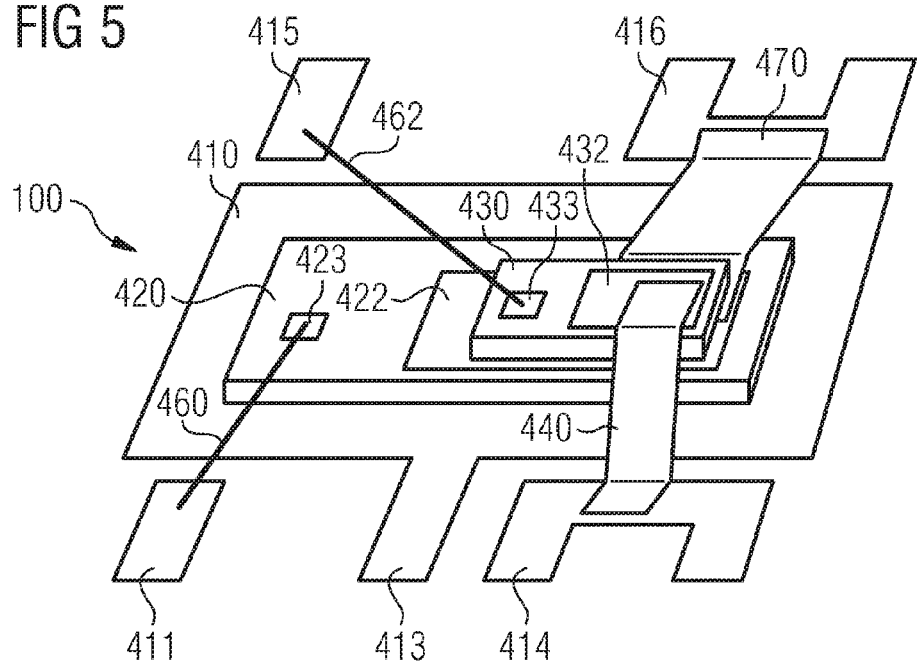
FIG. 5 schematically illustrates a foreshortened top view of the device 400 according to a further exemplary embodiment.

FIG. 5 schematically illustrates a foreshortened top view of the device 400 according to a further exemplary embodiment. In the present embodiment, the substrate 410 is implemented as a leadframe consisting of a die pad 410 and leads 411 to 416. The first semiconductor chip 420 may be a power semiconductor chip, in one embodiment a power MOSFET. A third electrode 423 of the first semiconductor chip 420 may be electrically coupled with a bond wire 460 to the lead 411. In one embodiment, the lead 411 may be a gate connection lead. A second electrode 422 of the first semiconductor chip 420 may be electrically coupled via the second electrically conducting element 470 to the lead 416. In one embodiment, the lead 416 may be a source connection lead. A first electrode (not visible) of the first semiconductor chip 420 is electrically coupled to the die pad 410, which is in turn electrically coupled to the lead 413. In one embodiment, the lead 413 may be a drain connection lead. Furthermore, the lead 413 may be a part of the die pad 410.

The second semiconductor chip 430 may be a power semiconductor chip, in one embodiment a power MOSFET. A third electrode 433 of the second semiconductor chip 430 may be electrically coupled with a bond wire 462 to the lead 415. In one embodiment, the lead 415 may be a gate connection lead. A first electrode (not visible) of the second semiconductor chip 430 may be electrically coupled via the second electrically conducting element 470 to the lead 416 and the second electrode 432 of the first semiconductor chip 420.

The first electrically conducting element 440 is implemented as a metallic clip structure electrically coupling the second electrode 432 of the second semiconductor chip 430 to the lead 414. The lead 414 may in one embodiment be a ground potential connection lead. For reasons of clarity, the mold material 450 covering the device 400 is not illustrated in FIG. 5. The mold material 450 may be arranged to expose parts of the leads 411 to 416.

The size, area of extension, thickness and orientation of the first semiconductor chip 420 and the second semiconductor chip 430 may vary and are not to be taken in a limiting sense when judging from the proportions illustrated in the drawings. In one embodiment, the form and area of extension of the electrodes of the semiconductor chips 420, 430 may vary and differ from the rectangular shape illustrated in the FIGS. 4 and 5. Additionally, the shape, size, thickness and planarity of the second electrically conducting element 470 may vary and are not to be taken in a limiting sense when judging from the proportions illustrated in the drawings.

Figure 6:
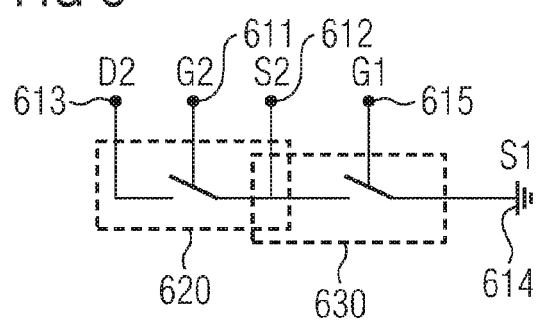
FIG. 6 schematically illustrates the wiring scheme of the device 400 according to a further exemplary embodiment.

FIG. 6 schematically illustrates the wiring scheme of the device 400 according to a further exemplary embodiment. The wiring scheme illustrated in FIG. 6 is a wiring scheme of a half-bridge circuit. The first semiconductor chip 420 is a power MOSFET 620 which is illustrated with the leftmost dotted line. The power MOSFET 620 includes a drain electrode 613 (D2), a source electrode 612 (S2) and a gate electrode 611 (G2). The second semiconductor chip 430 is a power MOSFET 630 which is illustrated with the rightmost dotted line. The source electrode 612 (S2) is coupled to the drain electrode of the power MOSFET 630, which comprises a gate electrode 615 (G1). The source electrode S1 of the power MOSFET 630 is coupled to the ground potential 614.

FIGS. 7A to 7E schematically illustrate processes of a method to fabricate a device which is illustrated in FIG. 7E.

According to FIG. 7A, a first semiconductor chip 420 is mounted over a substrate 410. The first semiconductor chip 420 may have the same properties and components as the first semiconductor chips 420 and 120 illustrated in FIGS. 1, 2, 4 and 5. A third electrode 423 of the first semiconductor chip 420 may be wire-bonded to the substrate 410 with a bond wire 460.

According to FIG. 7B, a second semiconductor chip 430 is mounted over the first semiconductor chip 420. The second semiconductor chip 430 may have the same properties and components as the second semiconductor chips 430 and 130 illustrated in FIGS. 1, 2, 4 and 5. A third electrode 433 of the second semiconductor chip 430 may be wire-bonded to the substrate 410 with a bond wire 462.

According to FIG. 7C, a first electrically conducting element 440 is mounted over the second semiconductor chip 430. A first surface 442 of the first electrically conducting element 440 is electrically coupled to a second electrode 432 of the second semiconductor chip 430. A second surface 443 of the first electrically conducting element 440 is electrically coupled to the substrate 410. The electrical connections between the first semiconductor chip 420 and the substrate 410, the second semiconductor chip 430 and the first semiconductor chip 420 as well as the first electrically conducting element 440 and the second semiconductor chip 430/the substrate 410 may be generated by diffusion soldering, reflow soldering, adhesive bonding by means of an electrically conductive adhesive or other known bonding techniques.

According to FIG. 7D, a mold material 450 is applied to the first semiconductor chip 420, the second semiconductor chip 430 and the substrate 410 in such a way that the first semiconductor chip 420 and the second semiconductor chip 430 are covered by the mold material 450. The substrate 410 may be completely covered by the mold material 450 as well. Alternatively, the mold material 450 may be arranged in such a way that the substrate 410 is only partially covered with the mold material 450. In one embodiment, the mold material 450 may be arranged in such a way that a surface of the substrate 410 opposite of the surface which the first semiconductor chip 420 is mounted over is exposed from the mold material 450. The mold material 450 is also arranged in such a way that the first electrically conducting element 440 is completely covered with the mold material 450. In one embodiment, the surface 441 is covered by the mold material 450.

According to FIG. 7E, parts of the mold material 450 are then removed to expose the surface 441 of the first electrically conducting element 440 from the mold material 450. In one embodiment, the mold material 450 may mainly be removed at a surface 451 of the mold material 450. The process of removing the mold material 450 may involve grinding, etching, cutting, dicing, drilling, laser ablating or other known methods for removing mold material. The mold material 450 may further be arranged to leave at least one surface 441 of the first electrically conducting element 440 uncovered, whereas other surfaces of the first electrically conducting element 440 may be covered with mold material 450. The exposed surface 441 of the first electrically conducting element 440 may form an essentially planar surface with a surface 451 of the mold material 450. Alternatively, the exposed surface 441 of the first electrically conducting element 440 may be elevated with respect to the surface 451 of the mold material 450 in a direction perpendicular to the first surface of the first semiconductor chip 420. According to a further embodiment, the exposed surface 441 of the first electrically conducting element 440 may be recessed with respect to the surface 451 of the mold material 450 in a direction perpendicular to the first surface of the first semiconductor chip 420.

As an alternative to the fabrication method illustrated in FIGS. 7A to 7E, it is also possible to encapsulate the substrate 410, the semiconductor chips 420 and 430, the electrically conducting element 440 and other components within the mold material 450 such that the surface 441 is not coated with the mold material 450 during the fabrication procedures. For example, a molding tool may be used which covers the surface 441 and prevents the surface 441 to be coated with the mold material 450.

Figure 8:
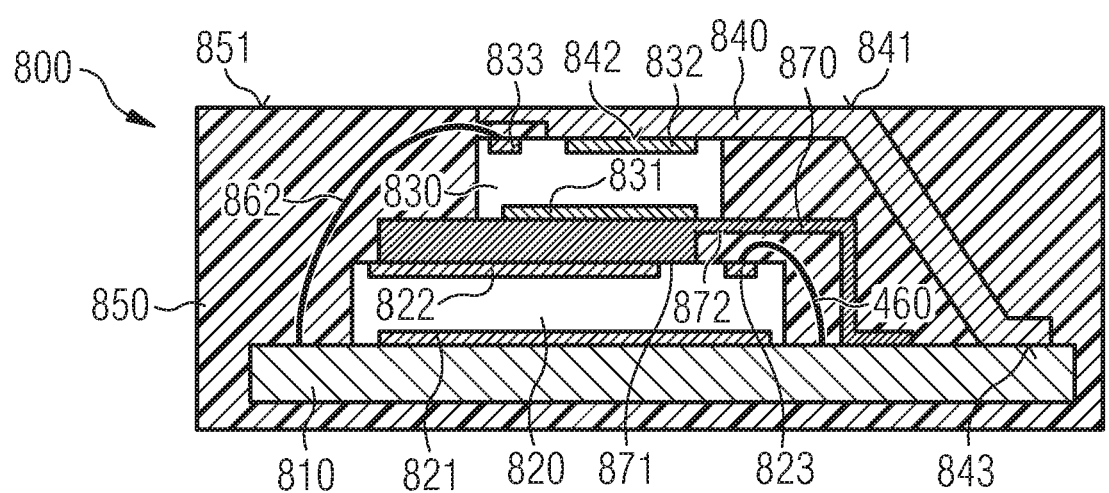
FIG. 8 schematically illustrates a side view of a device 800 according to a further exemplary embodiment.

FIG. 8 schematically illustrates a side view of a device 800 according to a further embodiment. A substrate 810, a first semiconductor chip 820 and a second semiconductor chip 830 are similarly arranged as in FIG. 4. What can further be seen from FIG. 8 are recess cavities formed between the electrically conducting elements 840 and 870 and the semiconductor chips 820 and 830.

A first recess cavity is formed between the first electrically conducting element 840 and an upper surface of the second semiconductor chip 830. The first recess cavity is configured to surround a portion of a bond wire 862 electrically coupling the substrate 810 to the electrode 833 of the second semiconductor chip 830. The first recess cavity may be filled with the mold material 850.

A second recess cavity is formed between the second electrically conducting element 870 and an upper surface of the first semiconductor chip 820. The second recess cavity is configured to surround a portion of a bond wire 860 electrically coupling the substrate 810 to the electrode 823 of the first semiconductor chip 820. The second recess cavity may be filled with the mold material 850.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
    a substrate;
    a first semiconductor chip mounted over the substrate;
    a second semiconductor chip having a first electrode and a second electrode on a first surface, the second semiconductor chip being mounted over the first semiconductor chip;
    an electrically conducting connection structure electrically coupling the first electrode of the second semiconductor chip to the substrate;
    a bond wire electrically coupled to the second electrode of the second semiconductor chip; and
    a mold material covering only portions of the electrically conducting connection structure leaving selected portions uncovered, wherein a recess cavity is defined between the electrically conducting connection structure and the second electrode.

2. The device of claim 1, comprising wherein the substrate is a leadframe.

3. The device of claim 1, comprising wherein the first electrically conducting connection structure is a metallic structure.

4. The device of claim 1, comprising wherein the first semiconductor chip has a first electrode on a first surface and a second electrode on a second surface opposite to the first surface.

5. The device of claim 4, comprising wherein the first electrode of the first semiconductor chip is electrically coupled to the substrate.

6. The device of claim 1, comprising wherein the second semiconductor chip has a first electrode on a first surface and a second electrode on a second surface opposite to the first surface.

7. The device of claim 6, comprising wherein the second electrode of the first semiconductor chip is electrically coupled to the first electrode of the second semiconductor chip.

8. The device of claim 6, comprising wherein the second electrode of the second semiconductor chip is electrically coupled to the first electrically conducting connection structure.

9. The device of claim 1, comprising wherein at least one of the first semiconductor chip and the second semiconductor chip is a power semiconductor chip.

10. The device of claim 1, comprising wherein a second electrically conducting connection structure is arranged between the first semiconductor chip and the second semiconductor chip.

11. The device of claim 10, comprising wherein the second electrically conducting connection structure electrically couples the first and second semiconductor chips to the substrate.

12. The device of claim 10, comprising wherein a second recess cavity is formed between the second electrically conductive connection structure and the first semiconductor chip.

13. The device of claim 1, comprising wherein a fixed electrical potential is applied to the first electrically conducting connection structure.

14. The device of claim 13, comprising wherein the fixed electrical potential is a ground potential.

15. The device of claim 1, comprising wherein a heat sink is applied onto the first electrically conducting connection structure.

16. The device of claim 1, comprising wherein the heat sink is electrically coupled to the first electrically conducting connection structure.

* * * * *